(12) United States Patent
Lin et al.

(10) Patent No.: US 8,221,133 B2
(45) Date of Patent: Jul. 17, 2012

(54) ELECTRICAL CONNECTOR ASSEMBLY FOR RETAINING MULTIPLE PROCESSING UNITS

(75) Inventors: Nan-Hung Lin, Tu-Cheng (TW); Chun-Yi Chang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 132 days.

(21) Appl. No.: 12/686,397

(22) Filed: Jan. 13, 2010

(65) Prior Publication Data
US 2010/0178781 A1 Jul. 15, 2010

(30) Foreign Application Priority Data
Jan. 13, 2009 (TW) .............................. 98200510 U

(51) Int. Cl.
*H01R 12/00* (2006.01)
(52) U.S. Cl. .......................... 439/66; 439/540.1; 439/71
(58) Field of Classification Search .................... 439/66, 439/540.1, 71, 330
See application file for complete search history.

(56) References Cited

U.S. PATENT DOCUMENTS

| | | | | |
|---|---|---|---|---|
| 3,815,077 A * | 6/1974 | Anhalt et al. | ................... | 439/70 |
| 6,174,174 B1 * | 1/2001 | Suzuki et al. | ................... | 439/71 |
| 6,586,684 B2 * | 7/2003 | Frutschy et al. | ............... | 174/260 |
| 7,128,580 B2 * | 10/2006 | Liao et al. | ........................ | 439/71 |
| 7,785,114 B2 * | 8/2010 | Brist et al. | ....................... | 439/71 |
| 2003/0064618 A1 * | 4/2003 | Chandran et al. | ............. | 439/330 |
| 2006/0228915 A1 * | 10/2006 | Sato et al. | ........................ | 439/71 |
| 2009/0081892 A1 * | 3/2009 | Liao | ................................ | 439/72 |

* cited by examiner

*Primary Examiner* — Hien Vu
(74) *Attorney, Agent, or Firm* — Andrew C. Cheng; Wei Te Chung; Ming Chieh Chang

(57) ABSTRACT

An electrical connector assembly (100) for electrically connecting a plurality of processing units (1) to a printed circuit board (8) comprises a substrate (4) and a plurality of sockets (6) assembled on the substrate (4) for retaining the processing units (1) respectively, the substrate (4) comprises a top surface (41) and a bottom surface (42) opposite to each other, the top surface (41) comprises a plurality of first contact elements (411) and the bottom surface (42) comprises a plurality of second contact elements (421), the socket (6) comprises an insulative housing (3) and a plurality of contacts (2) received therein for electrically contacting with one of the processing units (1).

5 Claims, 5 Drawing Sheets

ELECTRICAL CONNECTOR ASSEMBLY FOR RETAINING MULTIPLE PROCESSING UNITS

BACKGROUND OF THE INVENTION

1. Field of the Invention

The present invention relates to an electrical connector assembly, especially to an electrical connector assembly for retaining multiple processing units and the number of the central processing units can be set according to different requirements.

2. Description of the Related Art

A conventional processor has one core disposed therein. But with the development of the technology, the processor with one core can not satisfy the need. Thus, a processor with multiple cores is introduced. Generally, the multiple cores are encapsulated in a same package. When the processor is completed, the number of the cores is also determined. If customer needs a processor with more cores, the processor must be redesigned with a new one. This will increase the cost and the application is not flexible.

Hence, an improved processor with multiple cores is required to overcome the disadvantages mentioned above.

SUMMARY OF THE INVENTION

An object of the invention is to provide an electrical connector assembly with multiple sockets assembled on a substrate thereof and the sockets detachably retaining multiple processing units.

To achieve the above-mentioned object, an electrical connector assembly for electrically connecting a plurality of processing units to a printed circuit board comprises a substrate and a plurality of sockets assembled on the substrate for retaining the processing units respectively, the substrate comprises a top surface and a bottom surface opposite to the top surface, the top surface comprises a plurality of first contact elements and the bottom surface comprises a plurality of second contact elements, the socket each comprises an insulative housing and a plurality of contacts received therein for electrically contacting with the processing unit.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
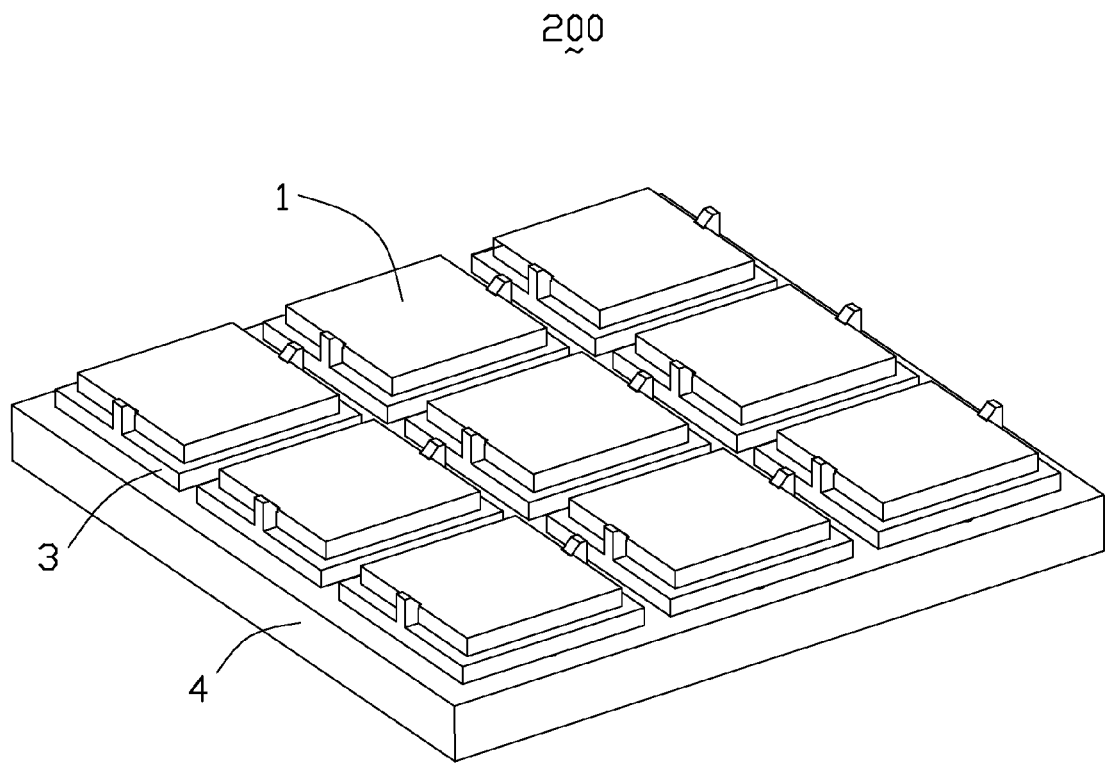
FIG. 1 is an assembled view of the electrical connector assembly in accordance with the present invention, and a plurality of processing units are assembled to the electrical connector assembly.

Reference will now be made in detail to the preferred embodiment of the present invention.

Referring to FIGS. 1-5, an electrical connector assembly 100 in accordance with the present invention is used for electrically connecting a plurality of processing units 1 to a printed circuit board 8. The electrical connector assembly 100 comprises a substrate 4 and a plurality of sockets 6 assembled on the substrate 4. The socket 6 comprises an insulative housing 3 and a plurality of contacts 2 received therein.

Figure 2:
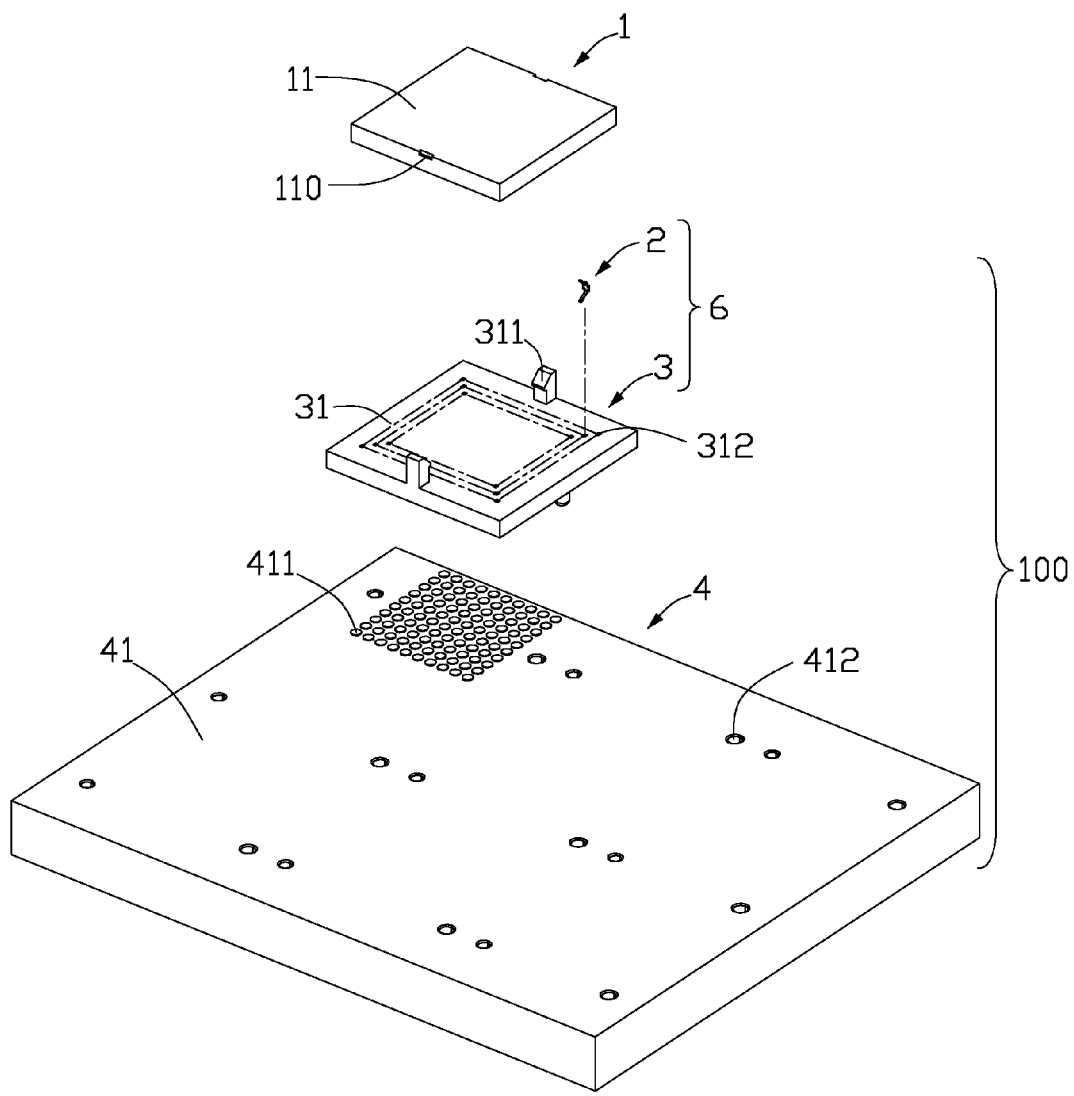
FIG. 2 is an exploded view of the electrical connector assembly shown in FIG. 1, only showing one socket.
Figure 5:
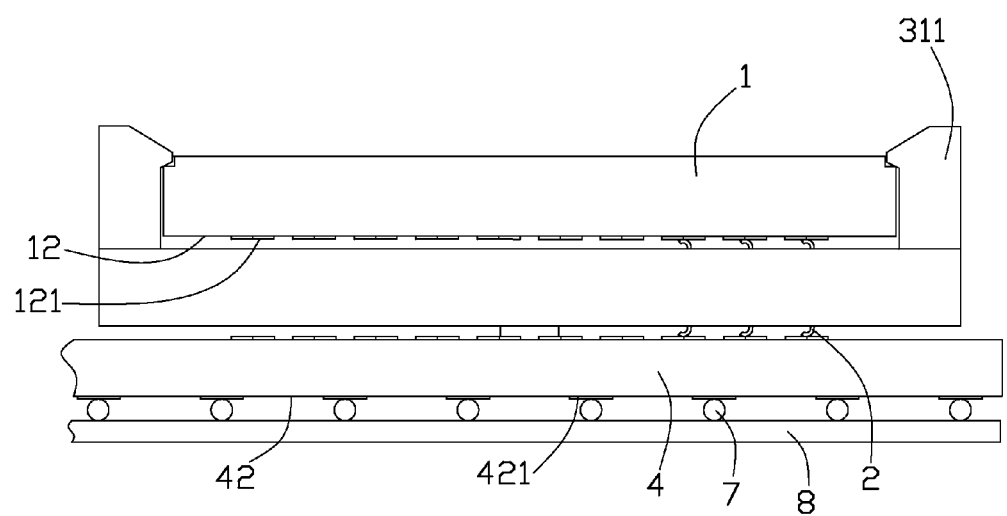
FIG. 5 is a side view of the electrical connector assembly shown in FIG.1.

Please referring to FIG. 2 and FIG. 5, the substrate 4 comprises a bottom surface 42 assembled to the printed circuit board 8 and a top surface 41 opposite to the bottom surface 42. The top surface 41 comprises a plurality of first contact elements 411, and the bottom surface 42 comprises a plurality of second contact elements 421. The top surface 41 also defines a plurality of holes 412 near the first contact element 411. The substrate 4 is electrically connected to the printed circuit board 8 through a plurality of solder balls 7 soldered to the printed circuit board 8.

Figure 4:
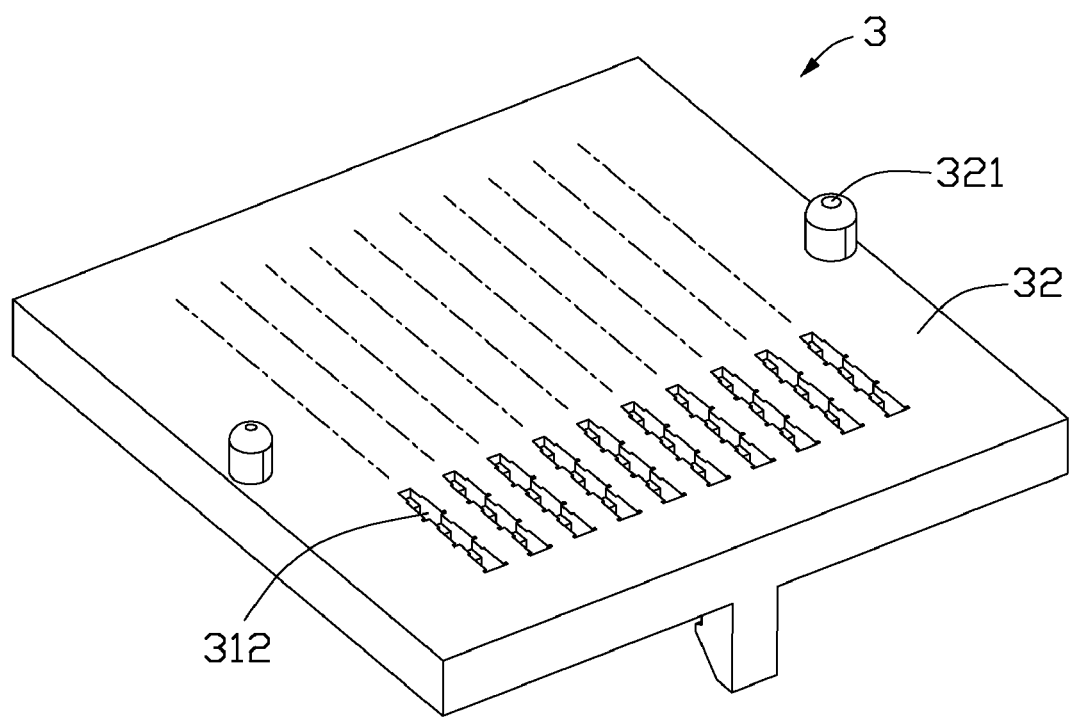
FIG. 4 is a bottom view of the insulative housing of the electrical connector assembly shown in FIG. 2.

Please referring to FIG. 2 and FIG. 4, the insulative housing 3 comprises a first surface 31 to support the processing unit 1 and a second surface 32 opposite to the first surface 31. The insulative housing 3 defines a plurality of passageways 312 extend from the first surface 31 to the second surface 32. The first surface 31 also has a pair of hooks 311, and the processing unit 1 defines a pair of recesses 110 to match with the hooks 311 to position the processing unit 1 on the insulative housing 3 securely. The bottom surface 32 has a pair of posts 321 to engage with the hole 412 of the substrate 4 respectively so as to position the socket 6 on the substrate 4 securely.

Figure 3:
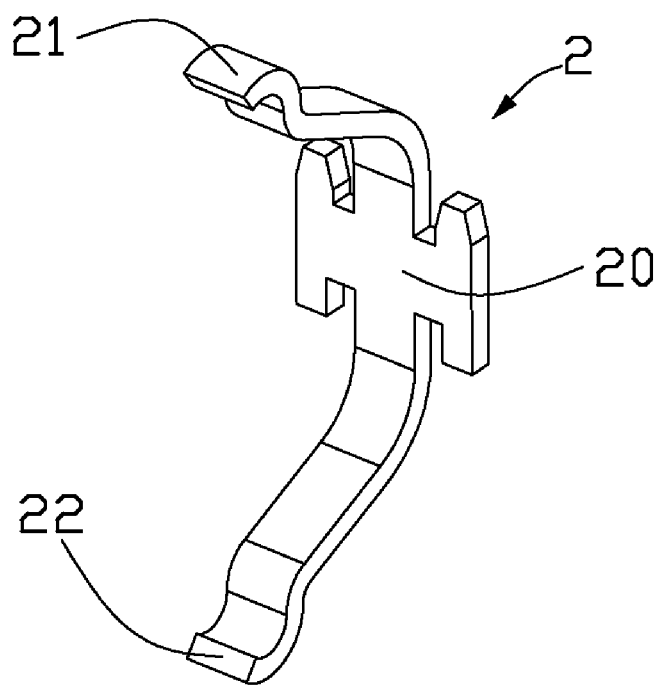
FIG. 3 is a perspective view of the contact of the electrical connector assembly shown in FIG. 2.

Please referring to FIG. 3, the contact 2 is received in the passageway 312 of the insulative housing 3 and comprises a body 20 assembled to the insulative housing 3, a first contact portion 21 extending beyond the first surface 31 and a second contact portion 22 extending beyond the second surface 32 of the insulative housing 3. The first contact portion 21 is used to contact with the processing unit 1 and the second contact portion 22 is used to contact with the first contact element 411.

Please referring to FIGS. 1-2, after the electrical connector assembly 100 is assembled. A plurality of sockets 6 are arranged on the substrate 4, and a plurality of processing units 1 are attached on the sockets 6 respectively. In the present invention, the processing unit 1 is a core. Therefore, the electrical connector assembly 100 and the multiple cores 1 form a central processing unit 200. Since the sockets 6 are detachably or immobably retained on the substrate 4 or the processing units 1 are detachably retained on the socket 6, the number of the processing units 1 can be elected according to different requirements. Furthermore, although the substrate 4 is soldered to the printed circuit board 8 directly, it also can be attached to the printed circuit board 8 via another socket 9 such as a pin grid array socket by forming a plurality of pins on the bottom surface 42 of the structure to replace the second contact elements 421 or a land grid array socket.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector assembly for electrically connecting a plurality of processing units to a printed circuit board, comprising:

a substrate comprising a top surface and a bottom surface opposite to each other, the top surface comprising a plurality of first contact elements and the bottom surface comprising a plurality of second contact elements;

a plurality of sockets assembled on the substrate for retaining the processing units respectively and each comprising an insulative housing with a plurality of contacts received for electrically contacting with one of the processing unit;

wherein each of the sockets is assembled on the substrate by a securing member;

wherein the securing member is a hole defined on the substrate and a post extended from the socket; and wherein each of the sockets also comprises a hook unitarily formed with the socket to engage with a recess on each of the processing units.

2. The electrical connector assembly as described in claim 1, wherein the sockets are detachably arranged on the substrate.

3. The electrical connector assembly as described in claim 1, wherein the second contact elements are pads soldered to the printed circuit board via a plurality of solder balls respectively.

4. The electrical connector assembly as described in claim 1, wherein the contact comprises a body assembled to the insulative housing, a first contact portion contacting with the processing unit and a second contact portion contacting with the first contact element of the substrate.

5. An electrical assembly comprising:

a printed circuit board defining an upper face;

an electrical connector mounted upon the upper face to electrically connect to the printed circuit board, said connector including an insulative housing with a plurality of contacts therein, each of said contacts including an upper section upwardly extending above a top face of the housing and a lower section extending downwardly beyond a bottom face of the housing; and an electronic package assembled upon the housing to electrically connect to the connector and comprising a recess; wherein said connector includes a latch on the top face matched with the recess of the electronic package to resist an upward force due to the upper sections of the contacts to hold the electronic package in position, and a post on the bottom face to position the connector upon the post inserted in a hole in the printed circuit board;

wherein the latch is unitarily formed with the housing;

wherein the post is unitarily formed with the housing.

* * * * *